US009660630B1

(12) United States Patent
Venkata et al.

(10) Patent No.: US 9,660,630 B1
(45) Date of Patent: May 23, 2017

(54) CLOCK GRID FOR INTEGRATED CIRCUIT

(71) Applicant: Altera Corporation, San Jose, CA (US)

(72) Inventors: Ramanand Venkata, Fremont, CA (US); Dana How, Palo Alto, CA (US); Christopher Lane, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/295,918

(22) Filed: Oct. 17, 2016

Related U.S. Application Data

(63) Continuation of application No. 14/137,086, filed on Dec. 20, 2013, now Pat. No. 9,503,057.

(51) Int. Cl.
*H03H 11/26* (2006.01)
*H03K 5/159* (2006.01)
*H03L 7/08* (2006.01)
*H03K 5/00* (2006.01)

(52) U.S. Cl.
CPC ........... *H03K 5/159* (2013.01); *H03L 7/0807* (2013.01); *H03K 2005/00019* (2013.01)

(58) Field of Classification Search
CPC ................. G06F 1/10; G06F 1/06; G06F 1/04
USPC ....... 327/261, 162, 170, 295, 297, 291–294; 713/500
See application file for complete search history.

(56) References Cited

U.S. PATENT DOCUMENTS 7,120,891 B2 * 10/2006 Yamamoto ................ G06F 1/10
716/126
7,228,451 B1 * 6/2007 Nguyen .................... G06F 1/10
326/39

OTHER PUBLICATIONS

Xilinx, "Mixed-Mode Clock Manager (MMCM) Module (v1.00a)"; Jun. 24, 2009.
Xilinx, "UltraScale Architecture Clocking Resources"; v1.0; Dec. 10, 2013.
Xilinx, "MMCM and PLL Dynamic Reconfiguration"; v1.6.1; Jun. 1, 2016.

\* cited by examiner

*Primary Examiner* — Lincoln Donovan
*Assistant Examiner* — Thomas Skibinski
(74) *Attorney, Agent, or Firm* — Fletcher Yoder, P.C.

(57) ABSTRACT

Systems and methods are provided for distributing clocks or other signals on an integrated circuit. In some aspects, one ore more distributed deskewing objects are provisioned for reducing or eliminating skew while linking multiple clock distribution segments into one clock tree of an arbitrary shape and size.

20 Claims, 9 Drawing Sheets

CLOCK GRID FOR INTEGRATED CIRCUIT

CROSS-REFERENCE TO RELATED APPLICATION

This is a continuation of U.S. application Ser. No. 14/137,086, filed Dec. 20, 2013, entitled "Clock Grid for Integrated Circuit," which is incorporated by reference in its entirety for all purposes.

FIELD OF THE INVENTION

This disclosure relates to the distribution of clocks or other signals on an integrated circuit.

BACKGROUND OF THE INVENTION

In the early days of programmable devices, global clock signals or other global signals could be distributed using the general global routing resources of the device. Device sizes were small enough and desired speeds were low enough that skew was not a particular concern. However, as programmable devices became larger and desired speeds became higher, skew became a concern. One solution to the problem of global clock skew or other global signal skew was the development of a clock tree network commonly referred to as an "H-tree," which allowed a clock signal or other global signals to be introduced at a single point on a device and be delivered to all points on the device with reduced skew.

However, as device sizes and speeds have continued to increase, the amount of metallization resources required to provide H-tree clock networks has increased dramatically and the margin for acceptable clock skew has decreased significantly. At the same time, the number of clocks and other signals to be distributed widely across a device also has increased dramatically. For example, devices frequently incorporate high-speed serial interfaces to accommodate high-speed signaling standards. Clocks derived from such interfaces using phase-locked loop (PLL), clock-data recovery (CDR), delay-locked loop (DLL), or dynamic phase alignment (DPA) techniques may have to be distributed throughout a device to wherever the associated data is being used or processed. Furthermore, many of these high-speed signaling standards involve multiple data streams, which may require multiple unique clock domains to be provided and consistently distributed throughout the device.

SUMMARY OF THE INVENTION

The present disclosure relates to efficiently distributing clock-type signals in an integrated circuit.

In one aspect of the present disclosure, a switch box for interconnecting clock-type signals in an integrated circuit is provided. The switch box includes a dedicated clock-type signal line, connected to a clock distribution spine on said integrated circuit, said dedicated clock-type signal line for conducting a selectable one of a first clock-type signal in a first direction and a second clock-type signal in a second direction. The switch box includes a selection circuitry for selecting as a selection output, one of the first clock signal in the first direction and the second clock signal in the second direction. The switch box includes a distributed deskewing object having a first input corresponding to the selection output of the selection circuitry and a second input corresponding to a clocking signal from the clock distribution spine, and an output coupled to the clock distribution spine.

In another aspect of the present disclosure, a signal network for distributing clock-type signals in an integrated circuit is provided that a plurality of clock regions, each clock region of the clock regions corresponding to a respective portion of the integrated circuit. The signal network includes a plurality of switch boxes, each switch box from the plurality of switch boxes located at an intersection of a subset of the plurality of clock regions.

In another aspect of the present disclosure, a method is provided of interconnecting clock-type signals in an integrated circuit. A selectable one of a first clock-type signal in a first direction and a second clock-type signal in a second direction is selected using a dedicated clock-type signal line connected to a clock distribution spine on said integrated circuit. One of the first clock signal in the first direction and the second clock signal in the second direction is selected as a selection output. One of the selection output of the selection circuitry and a second input corresponding to a clocking signal from the clock distribution spine is selectively deskewed to generate an output coupled to the clock distribution spine.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION

Figure 1:
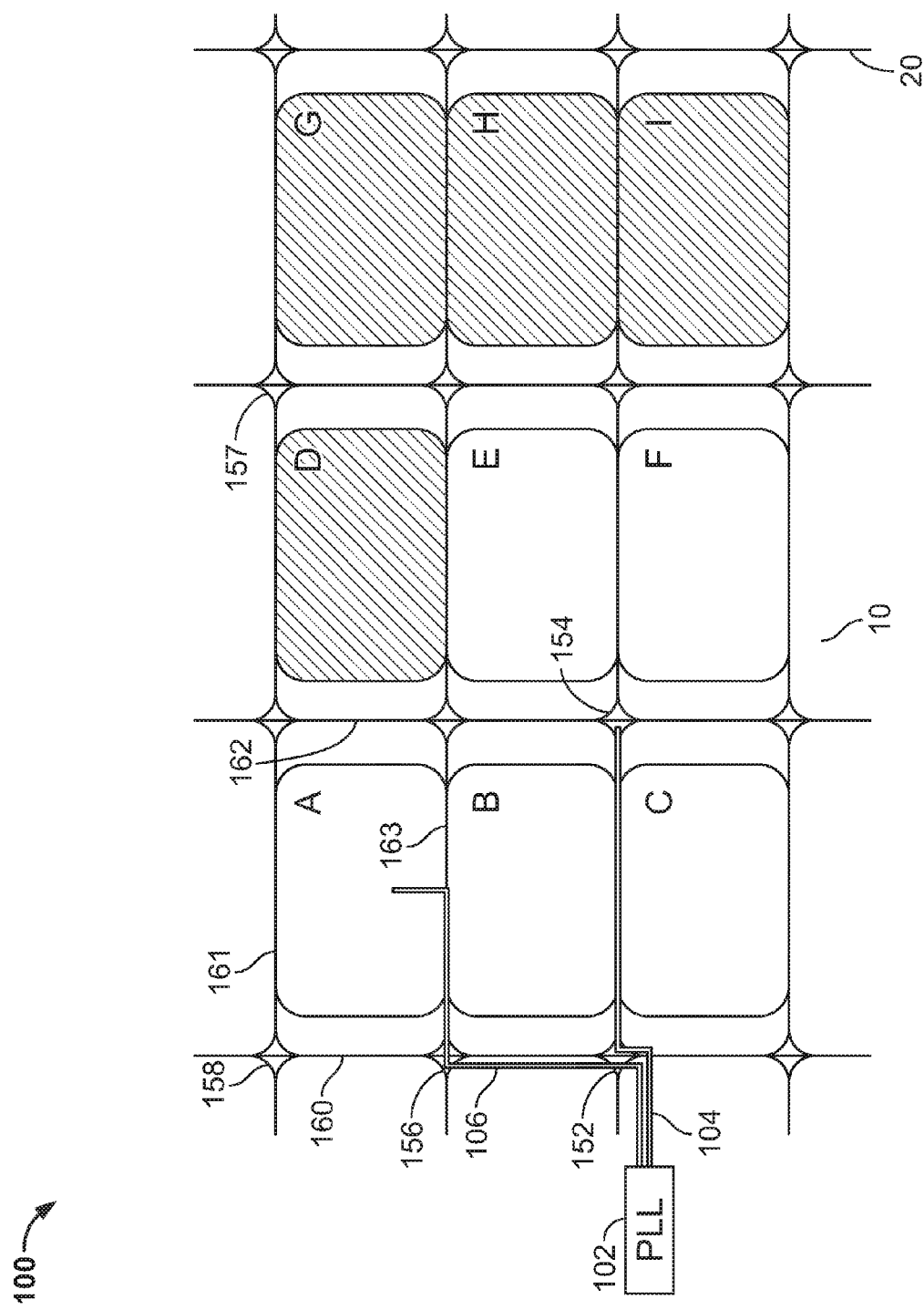
FIG. 1 shows a device 10 with a clock network 20 in accordance with some embodiments.

Known devices, such as the STRATIX® family of PLDs available from Altera Corporation, of San Jose, Calif., distribute device-wide clocks using H-tree clock networks of the type described above. For example, in devices in the aforementioned STRATIX® family, one or more H-trees may be available, and clock (or other) signals can be driven onto an entire H-tree or onto quadrants of an H-tree. These clocks may be referred to as global clocks (GCLK) and quadrant clocks (QCLK), and typically their number is substantially independent of device size. On the other hand, the number of potential periphery clocks (PCLK) may increase substantially in direct proportion to the size of the device. That is, as the number of peripheral I/O regions increases, so too does the number of clocks that may need to be distributed over all, or a large portion of, the device from any particular peripheral I/O region.

Systems and methods disclosed herein distribute clock-type signals using clock architectures according to high-level topologies that allow for very low-skew clock domains of arbitrary shapes and sizes. For example, the disclosed systems and methods may allow creation of clock trees in any region of the integrated circuit. In some implementations, the disclosed systems and methods may allow post-manufacturing creation of custom clock regions. Such post-manufacturing creation may correspond to post-silicon creation of custom clock regions in programmable devices such as programmable logic devices (PLDs) and field-programmable gate array (FPGA) devices.

The disclosed systems and methods may allow a number of significant advantages. First, the disclosed systems and methods may result in significant advantages in the speed of integration of integrated circuit design, such as time to manufacturing or silicon and/or time to market. Second, the disclosed systems and methods may result in significant advantages in the flexibility of software logic domain placement. Third, the disclosed systems and methods may result in achieving aggressive performance goals at high speeds. These and other advantages will be illustrated in the various embodiments below.

Clock signals derived at the periphery of an integrated circuit may be conducted to a central periphery clock bus from which one or more of the clock signals may be driven onto a widely distributed clock network. The widely distributed clock network may cover the entire device or a substantial portion of the integrated circuit. In some embodiments, the widely distributed clock network could be provided particularly for this purpose. In some embodiments, the widely distributed clock network is the aforementioned H-tree network or another wide-area signal network. In such embodiments, the peripheral clocks are not conducted from the base of the H-tree, but rather are conducted over different distances to the aforementioned periphery clock bus, thereby potentially introducing some skew between the different clock paths.

An integrated circuit may have embedded high-speed transceivers in its I/O regions. Those transceivers may, for example, be arranged in "quads" in accordance with the XAUI standard, and thus may have a plurality of available clocks. Alternatively, the device may lack embedded transceivers, but may nevertheless have high-speed serial interfaces including clock-data recovery capability and/or dynamic phase alignment capability. Either way, within the CDR or transceiver circuitry, mechanisms, such as a selector circuitry, may be provided to select an available clock for propagation to the periphery clock bus. If the number of peripheral I/O regions is equal to or less than the number of rows of logic regions in a programmable core of the device, then preferably every I/O region can drive a clock signal onto the periphery clock bus. However, if the number of peripheral I/O regions is greater than the number of rows of logic regions in the programmable core of the device, and if the number of clocks that can be driven across the various rows of logic is such that the total number of peripheral clocks exceeds the total number of clocks that can be driven across the rows of logic, then there may be additional selector circuitry to determine which clocks are driven onto the periphery clock bus.

In some embodiments, there is added to each I/O region of a device, selection circuitry for providing, in accordance with user programming, a clock from among multiple candidate clock signals, including but not limited to, (a) a recovered clock output by DPA or other clock recovery circuitry, (b) a clock signal input directly from an I/O pad, (c) a clock signal generated in the programmable logic core, or (d) ground (in case the user needs to "turn off" a particular input).

In some embodiments, there is added to each I/O region of a device, selection circuitry for providing, in accordance with user programming, a clock from among multiple candidate clock signals, including but not limited to, (a) one or more transceiver clocks, which may include (1) the transceiver quad transmit clock, and/or (2) the transceiver quad receive or transceive clock, (b) a clock signal generated in the programmable logic core, or (c) ground (in case the user needs to "turn off" a particular input).

The clocks distributed according to some embodiments may be widely distributed throughout an integrated circuit. Such distribution typically introduces skew, such as skew between signals originating at the same source and routed to two different destinations, or skew between two different signals originating at two different peripheral I/O regions and routed to the same destination, based on the different distances of the different I/O regions from the central periphery clock bus. Traditionally, the central periphery clock bus is arranged so that such differences are reduced and therefore result in reduced signal-to-signal skew. For example, traditionally, the central periphery clock bus can be arranged at a midpoint of a group of I/O regions, so that at most signals need to travel half the width of the group to reach the central periphery clock bus. However, such reduced signal-to-signal skew may still be inacceptable where performance targets are too high.

In the device portion (e.g., region or tile) over which a particular periphery clock network is distributed, the periphery clock network may include one or more clock spines. These could be dedicated to the periphery clock network or could be portions of one or more existing wide-area signal networks. If the periphery clock network includes multiple such spines (which may generally be the case if an existing network is being used, but may not be the case in a dedicated network), there may be some skew from one spine to the other because the signal is travelling from the periphery to each spine via the same central periphery clock bus. Traditionally, the amount of skew is expected to be low, and the device is programmed so that the resulting clock signal skew that might result could be tolerated. However, such reduced spine-to-spine skew may still not be acceptable where performance targets are too high.

Systems and methods for reducing such skew will now be described with reference to FIGS. 1-6 below.

FIG. 1 shows a device 10 with a clock network 20 in accordance with some embodiments. Device 10 includes multiple portions A through I, and a clock network 20 for distributing clocks or other signals throughout various portions of device 10. As shown, each portion A through I is surrounded by a plurality of clock-type lines. For example, portion A is surrounded by a track formed by clock lines 160, 161, 162, and 163. Clock network 20 includes 16 switch box elements located according to a grid between pairs or quadruples from the portions of device 10. The grid shown is a highly regular, predictable, clock mesh which easily extends periphery or global clock busses into the device's fabric. Of the switch box elements shown in FIG. 1, switch box elements 152, 154, and 156 are activated, so that portions A, B, C, E, and F are provided with clock-type signals based on the output from PLL circuit 102. For example, line 104 is activated and conducts clock-type signals to portion A. Line 104 is activated and conducts clock-type signals to portions B, E, C, and F. Conversely, other switch box elements, such as switch box element 157 and 158, are not activated. In this case, portions D, G, H, and I are not provided with clock-type signals from PLL 102. The switch box elements may be sparsely populated The regularity of clock network 20 may be exploited by software and/or hardware design tools to configure clock generation mechanisms as needed. For example, the regularity of clock network 20 may be exploited by a clock planner tool to configure PLL in a programmable integrated circuit to send different phases to various clock regions as needed, in order to bond them into one clock region, as exemplified by portions A, B, C, E, and F of device 10.

Any block, part of a block, or a set of blocks of device 10 may constitute a portion, tile, or region of device 10. In some embodiments, device 10 is a PLD and portions A through I of device 10 may correspond to logic regions or tiles and may be identical or different. Device 10 may include an arbitrary number of tiles, arranged in a desired configuration. Device 10 can be a Programmable Logic Device (PLD), Field Programmable Gate Array (FPGA), Application Specific Integrated Circuit (ASIC) or Application Specific Standard Product (ASSP). It should be appreciated that device 10 refers to any suitable device.

The topology described herein is easily scalable and extends to various sizes and shapes. For example, clock network 20 may allow distribution of clock signals or other signals with minimal skew regardless of the number of tiles in device 10. The switch box elements may be sparsely populated and activated as needed, which increases performance and reduces cost.

Figure 2:
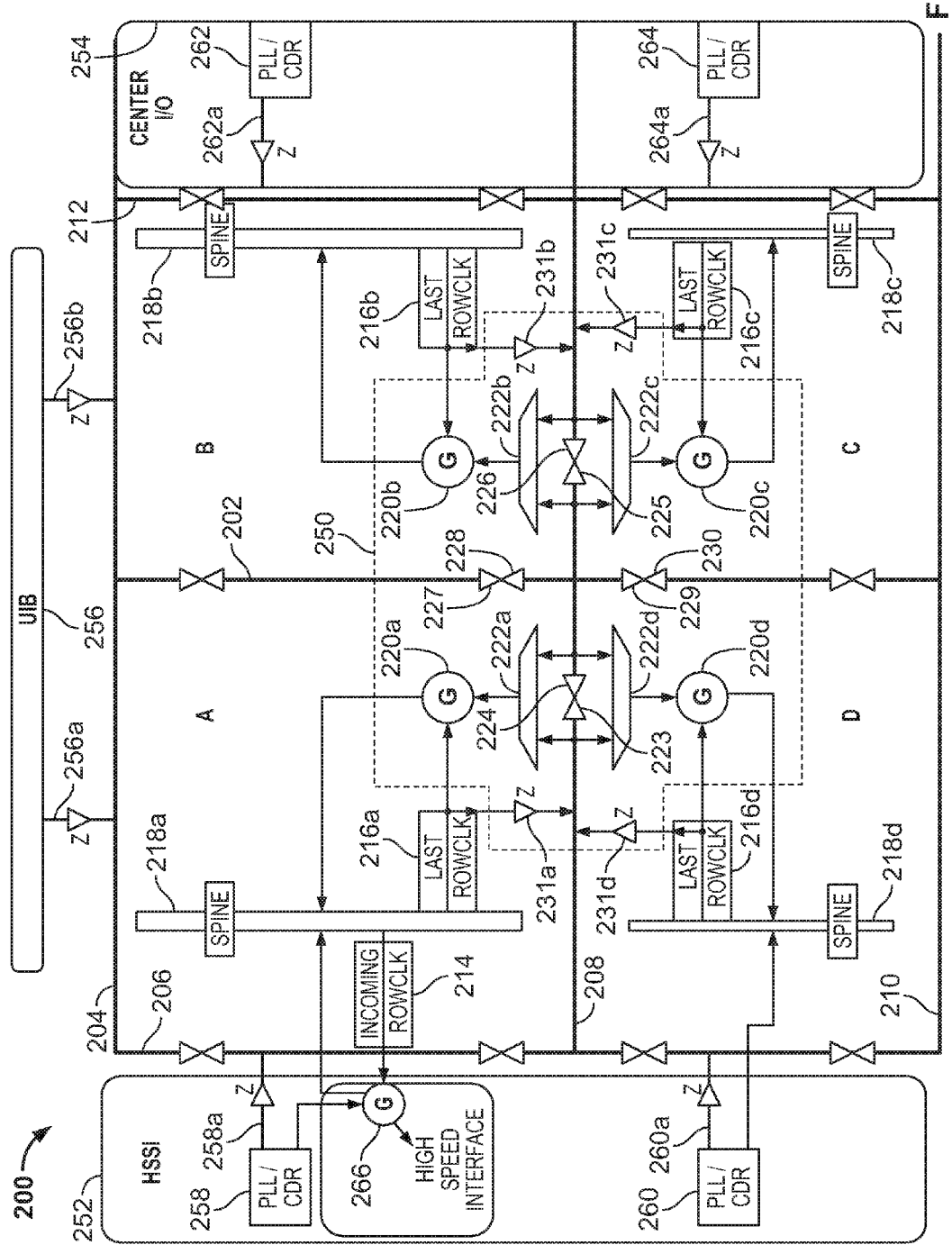
FIG. 2 shows a clock grid node including a switch box element in accordance with some embodiments.

FIG. 2 shows a clock grid node 200 including a switch box element 250 according to some embodiments. Switch box element 250 is located at the intersection of four portions A, B, C, and D of a device similar to device 10 of FIG. 1, and is one possible implementation of any one of the switch box elements of FIG. 1 above. Clock grid node 200 also includes illustrative input/output blocks such as universal integration bus (UIB) 256, high-speed serial interface (HSSI) block 252, and center input/output block 254. These blocks are meant for the purpose of illustration not limitation and it will be appreciated that any suitable input and/or output block may be used without departing from the scope of this disclosure.

FIG. 2 shows horizontal individual clock lines 204, 208, and 210, and vertical individual clock lines 206, 202, and 212. Each of these individual clock lines may be directly connected to buses corresponding to periphery clock networks, such as UIB 256, HSSI block 252, and/or center I/O block 254. For example, clock line 204 is connected to UIB 256 through lines 256a and 256b; clock line 206 is connected to PLL/CDR circuitry 258 through line 258a and to PLL/CDR circuitry 260 through line 260a; and clock line 212 is connected to PLL/CDR circuitry 262 through line 262a and to PLL/CDR circuitry 264 through line 264a. Although the clock lines are driven using PLL feedback signals, other sources can be used, such as GCLK signals, QCLK signals, ground, PCLK signals or in any other suitable way.

FIG. 2 also shows four clock spines 218a, 218b, 218c, and 218d. These clock network spines could be a separate, dedicated clock spine, such as spines 218b and 218c. Alternatively, these clock network spines could be driven by clock lines from input/output blocks, such as spines 218a and 218d. As shown, the periphery clock network lines from PLL/CDR circuitries 258 and 260 of HSSI block 252 drive clock network spines 218a and 218d, which may cover a portion of a wide-area signal network on an integrated circuit such as device 10 of FIG. 1. The periphery clock network lines may drive the spines directly or via deskewing circuitry such as a distributed deskew object. For example, the periphery clock network PLL/CDR circuitry 258 drives spine 218a via a distributed deskew object 266, while the periphery clock network PLL/CDR circuitry 260 drives spine 218d directly.

In the embodiment of FIG. 2, there are four clock spines 218a, 218b, 218c, and 218d in each portion A, B, C, and D, respectively. However, there may be only one such spine or there may be more than four such spines (not shown). Clock spines 218a, 218b, 218c, and 218d may be a portion of a wide-area signal network of device 10. There might be additional skew introduced because of the different distances that a signal would have to travel along periphery clock network lines to each clock spine.

Switch box element 250 includes distributed deskew objects 220a, 220b, 220c, and 220d, selection circuitries 222a, 222b, 222c, and 222d, and drivers 223 through 230.

Clock lines from any one of the spines may be deskewed using distributed deskew objects. For example, last rowclk 216a is deskewed based on the signal on clock line 208 output by selector circuitry 222a, and is returned back to spine 218a. Similarly last signals rowclk 216b, 216c, and 216d are deskewed based on the signal on clock line 208 output by selector circuitry 222b, 222c, and 222d, respectively, and are returned back to spines 218b, 218c, and 218d, respectively.

Switch box 250 is merely one implementation of a switch box element for stitching together clock structures from multiple portions of an integrated circuit. Various elements of FIG. 2 can be modified without departing from the scope of the disclosure. For example, all drivers are optional and selection circuitries may be replaced with other circuitry for driving signals in a first or second direction of a clock line, without departing from the scope of disclosure. Also, although FIG. 2 shows only one node, it should be understood that any suitable number of these nodes may be implemented to form a clock grid or structure as described herein. For example, 16 such nodes may be used to form clock structure 20 of illustrative device 10.

Figure 3:
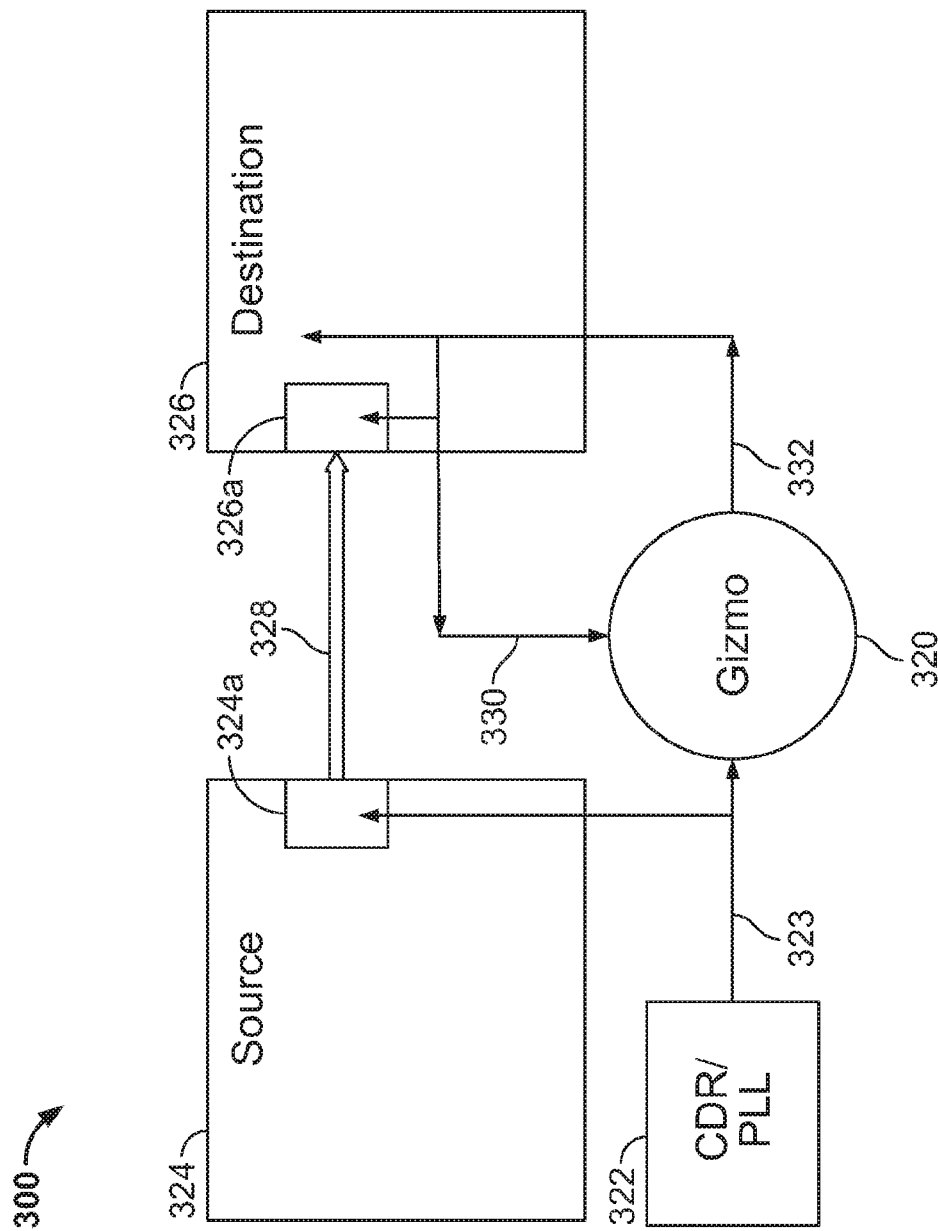
FIG. 3 illustrates a clock structure including a distributed deskew object in accordance with some embodiments.

Illustrative implementations of a distributed deskew object such as distributed deskew objects 220a, 220b, 220c, 220d, and/or 266, are shown in FIGS. 3 and 4 below.

FIG. 3 illustrates clock structure 300 with a distributed deskew object 320 according to some embodiments. As shown, clock structure 300 of FIG. 3 includes CDR/PLL circuitry 322 for providing one or more clock signals 323 to component 324a of clock signal source 324 and to the distributed deskew object 320 (also referred to as gizmo). Distributed deskew object 320 provides one or more clock signals 332 to clock destination object 326 and to component 326a of clock destination object 326. Source object 324 and destination object 326 may correspond to any portion of an integrated circuit, an input/output block, a clock network, or any other suitable structure. A feedback signal 330 is returned to distributed deskew object 320 for deskewing purposes, so that the difference between feedback signal 330 and original clock signal 323 is processed by distributed deskew object 320 in generating clock signal 332.

Figure 4A:
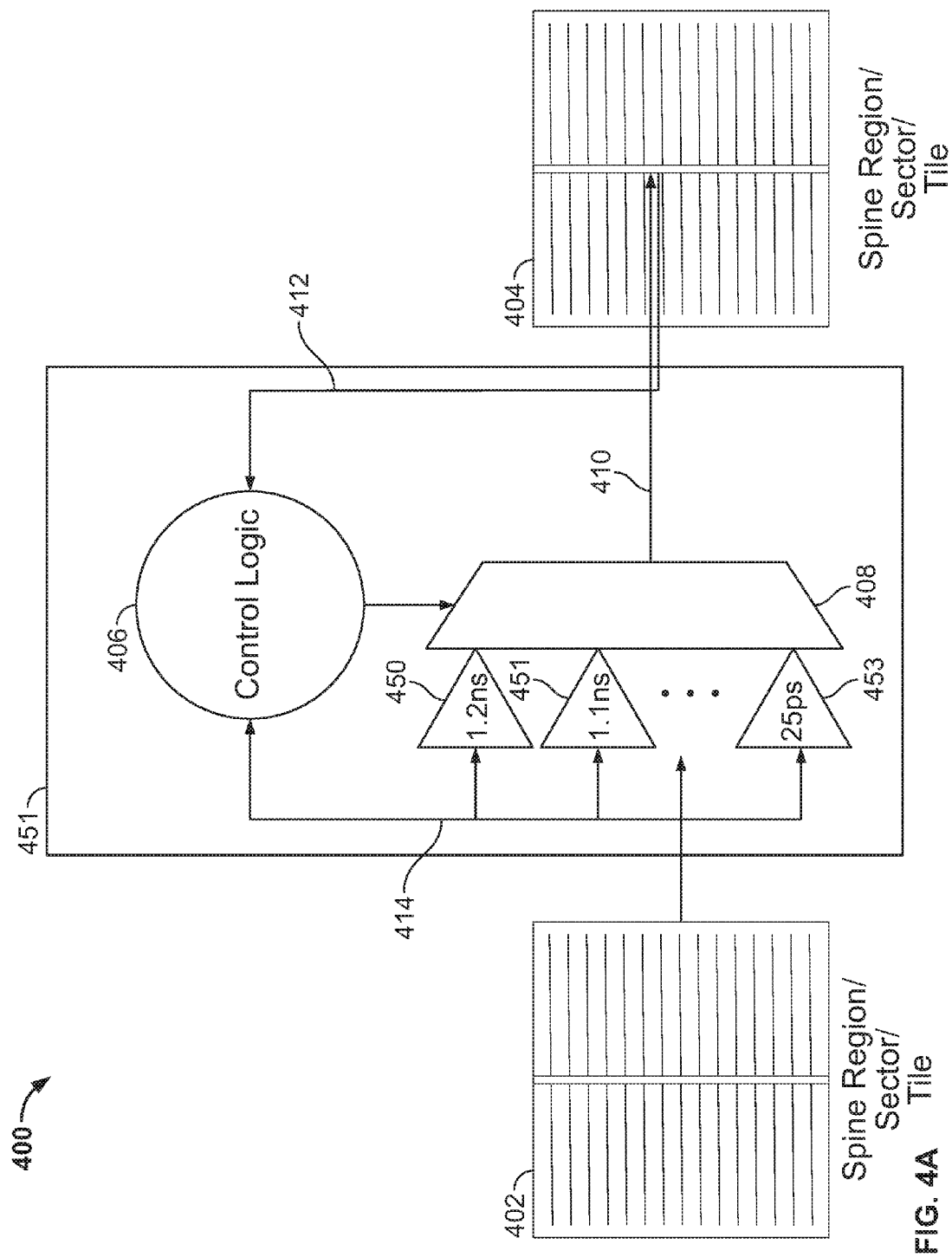
FIG. 4A illustrates a clock structure including a distributed deskew object in accordance with some embodiments.

An illustrative implementation of control logic of a distributed deskew object is shown in FIG. 4A. FIG. 4A illustrates clock structure 400 including distributed deskew object 451 and spine regions 402 and 404. Each one of these regions may be a region, sector, tile, and/or any suitable portion of a clock spine/structure in an integrated circuit, input/output block, and/or clock network structure. The clock spine may be similar to clock spines 218a, 218b, 218c, or 218d of FIG. 2. As shown in FIG. 4A, the control logic 406 of distributed deskew object 451 receives a clock signal 414 from spine region 402. The control logic processes signal 414 to determine a proper deskewing delay to introduce to signal 414 in order to generate deskewed clock signal 410. The deskewed clock signal 410 is received and possibly consumed by spine region 404, which may be connected or stitched together with spine region 402. A feedback signal 412 may also be returned from spine region 404 to control logic 406 to determine the proper deskewing delay.

In the illustrative implementation of FIG. 4A, the proper deskewing delay may be selected for aligning clock edges of input signal 414. The selection may be performed using selection circuitry 408, as controlled by control logic 406. For example, selection circuitry 408 may select the proper deskewing delay from a set of possible delays, of which illustrative delays 450, 451, and 453 are shown. These delays are only exemplary, and can be set to any suitable value. For example, these delays can be user-programmed or predetermined, and may be specified based on design parameters such as allowable skew and target performance.

In some implementations, control logic 406 may be programmed (e.g., user-programmed) to operate in one of multiple modes. In one mode, the control logic may be deactivated, e.g., so that no deskewing DLL function is applied by distributed deskew object 451. This may be done where no additional deskewing functions are needed, e.g., where the integrated circuit design allows for relatively large skew margins. In another mode, the control logic may be activated to operate in static deskew mode, so that the deskew delays may be fixed at the beginning of the operation of the integrated circuit and used thereafter for deskewing. In yet another mode, the control logic may be activated to operate in dynamic deskew mode, so that the delays are dynamically adjusted throughout the operation of the integrated circuit, e.g., based on feedback signal 412.

Figure 4B:
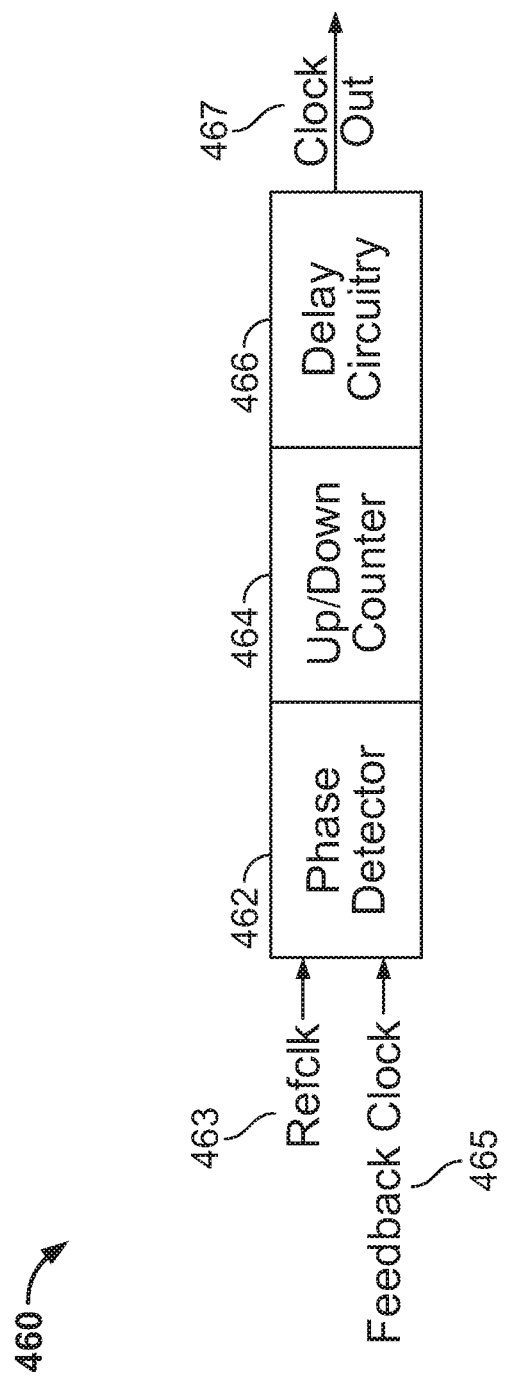
FIG. 4B is a block diagram of an illustrative distributed deskew object in accordance with some embodiments.

FIG. 4B is a block diagram of an illustrative distributed deskew object 460 in accordance with some embodiments. Illustrative distributed deskew object 460 includes three components: a phase detector 462, an up/down counter 464, and a delay circuitry 466. The distributed deskew object 460 provides an output clock 467 that is delayed by an amount proportional to the value of the up/down counter 464. The phase detector 462 updates the value of the up/down counter 464, e.g., by outputting UP increments and/or DOWN decrements, until the phase of the input reference clock REFCLK 463 is substantially equal to the phase of the input feedback clock 465.

The delay circuitry 466 may be implemented in any suitable way, to introduce an adjustable delay to the feedback clock signal so that the phase of the feedback clock matches that of REFCLK. In one exemplary implementation, the delay circuitry 466 is a chain of multiple, N delay elements, each element having a delay block coupled to the input of a 2-to-1 multiplexer. These elements can be equally sized or, alternatively, correspond to different delay values. The 2-to-1 multiplexer of each $i^{th}$ element (i=1, ..., N) can select, as its delay output, the output of the delay block of the same $i^{th}$ element or the delay output from the previous, $(i-1)^{th}$ element. Initially, all delay blocks may be bypassed by the multiplexers in the chain of delay circuitry 466, and then an increasing number of delay blocks may be added by the counter to the path of the delay chain, until the phases of the REFCLK and feedback signal are substantially equal.

The implementation above is only exemplary, and it should be understood that other circuitries and algorithms for adjusting phases of signals may be used without departing from the scope of this disclosure.

Figure 5:
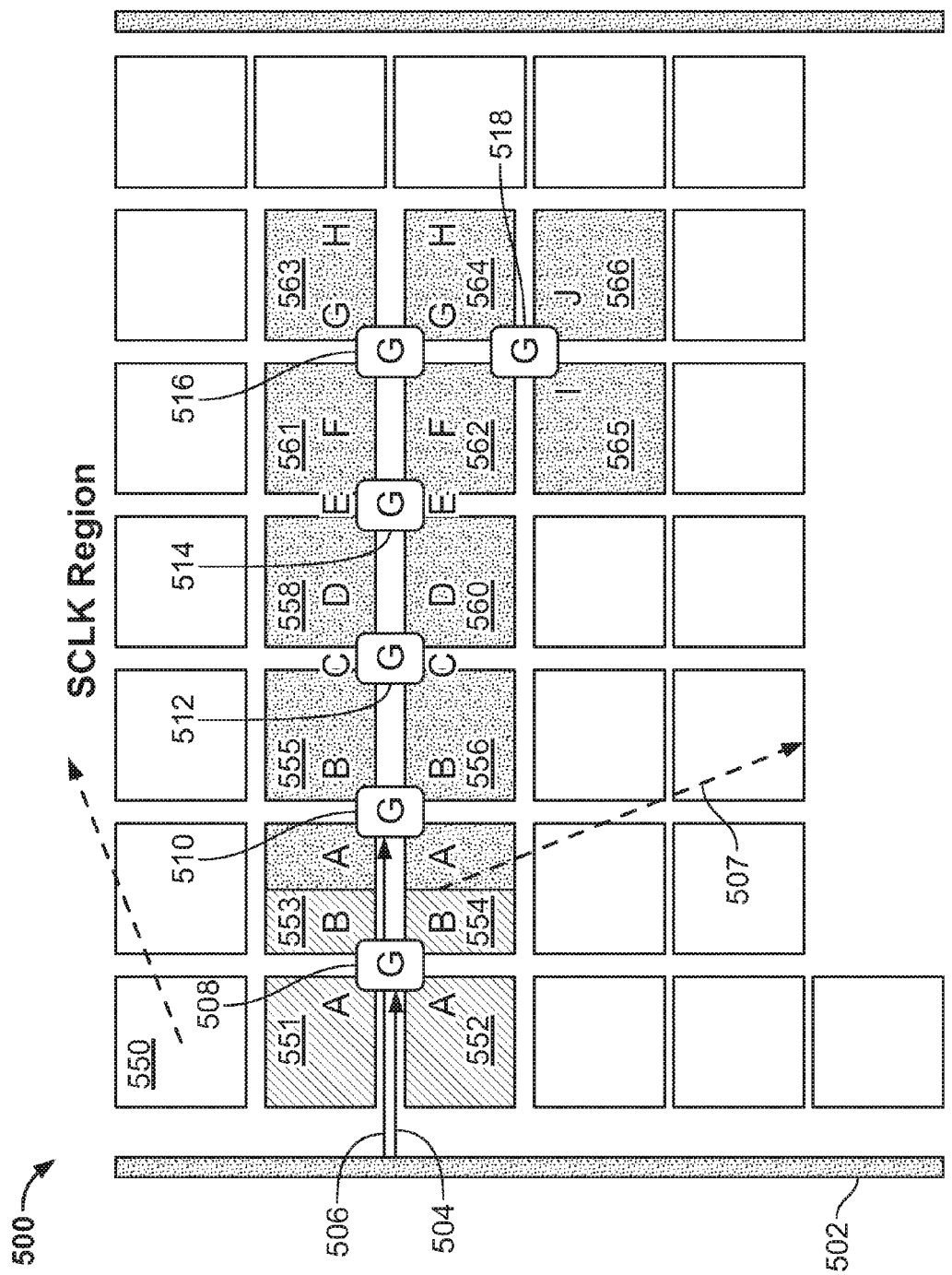
FIG. 5 illustrates a clock grid using distributed deskew objects, according to some embodiments.

FIG. 5 illustrates a clock grid 500 using distributed deskew objects such as the ones described above, according to some embodiments. Clock grid 500 is one representation of a clock topology according to the present disclosure, for forming clock networks of arbitrary sizes and shapes. As shown, clock grid 500 includes multiple spine clock (SCLK) regions that may be stitched together to form customizable clock trees. Each portion of grid 500 corresponds to one SCLK region, of which region 550 is an example. A first SCLK region may be connected to a second SCLK region to form custom clock regions, created by clock propagation from the first SCLK region to the second SCLK region. A switch box element is represented by the letter G in FIG. 5. Switch box elements may be implemented as described in reference with FIG. 2 above, so that skew may be canceled by the distributed deskew object as configured. In the illustration of FIG. 5, SCLK regions 551, 552, 553, and 554 are connected through switch box element 508, which receives a global clock signal from global clock bus 502 through clock line 504. Similarly, SCLK regions 553, 554, 555, 556, 558, 560, 561, 562, 563, 564, 565 and 566 are connected through switch box elements 510, 512, 514, 516, and 518. Switch box element 510 receives a global clock signal from global clock bus 502 through clock line 506. In some implementations, four distributed deskew objects are needed to bond four SCLK regions in one clock tree. For example, switch box element 508 may contain four distributed deskew objects to bond SCLK regions 551 through 554 into one clock tree. However, any number of distributed deskew objects and any number of clock regions may be connected without departing from the scope of this disclosure. Clock trees may correspond to different or identical clock domains, represented in FIG. 5 by letters A, B, C, D, E, F, G, H, I, and J. Clock domain transfer 507 may represent a change between two standard clock domains, such as soft Physical Coding Sublayer (PCS) and Media Access Control (MAC), MAC and a higher-level aggregator, or any suitable clock domain transfer.

Figure 8:
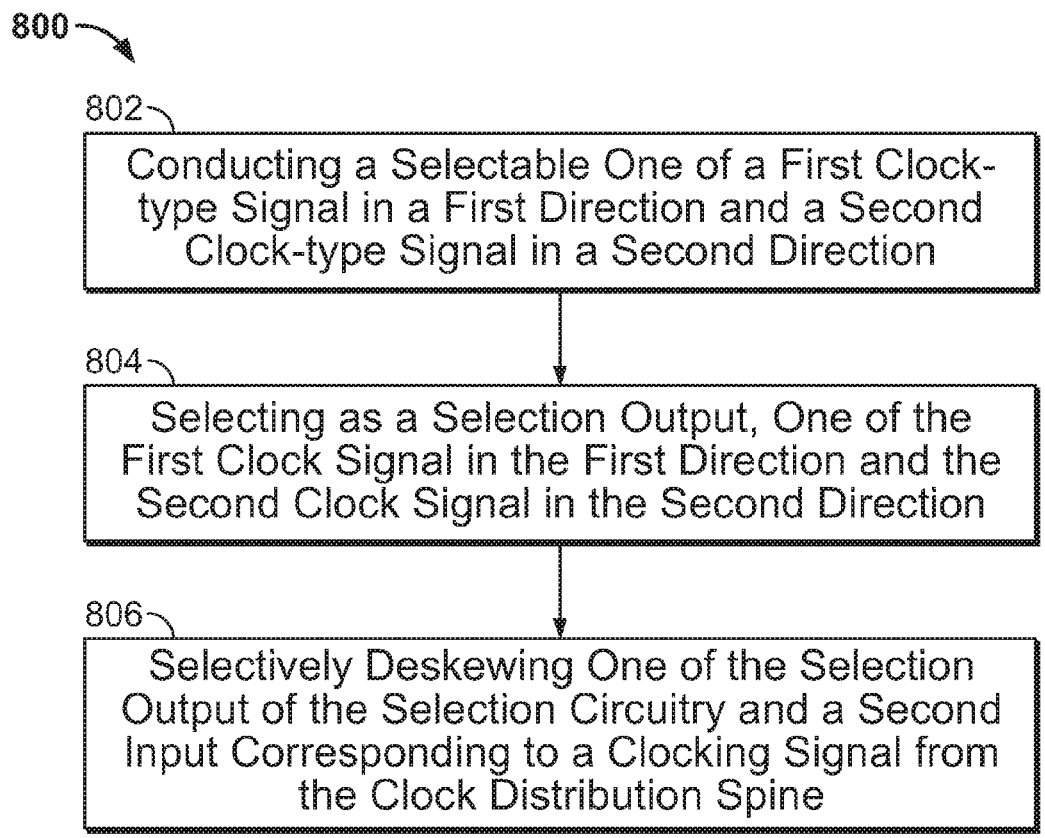
FIG. 8 is a flow diagram illustrating a process for interconnecting clock-type signals in an integrated circuit, in accordance with some embodiments.

FIG. 8 is a flow diagram 800 illustrating a process for interconnecting clock-type signals in an integrated circuit such as device 10, in accordance with some embodiments. The integrated circuit may have one or more dedicated clock-type signal lines connected to a clock distribution spine on the integrated circuit, such as clock spines shown in FIG. 2.

At 802, a first clock-type signal is conducted in a first direction or a second clock-type signal is conducted in a second direction. Such selective routing may be done, for example, using one of the dedicated clock-type signal lines, such as individual horizontal clock line 208 of FIG. 2.

At 804, a selection output is selected from either the first clock signal in the first direction or the second clock signal in the second direction. This may be done, for example, using selection circuitry located in a switch box element, such as switch box element 250 of FIG. 2.

At 806, selective deskewing is performed, either on the selection output generated from 804 or on another clocking signal, e.g., another clocking signal from the clock distribution spine. This step may be performed using a distributed deskew object, such as the distributed deskew object 460 of FIG. 4B above. An output of this step may include a deskewed clocking signal coupled to the clock distribution spine.

Figure 9:
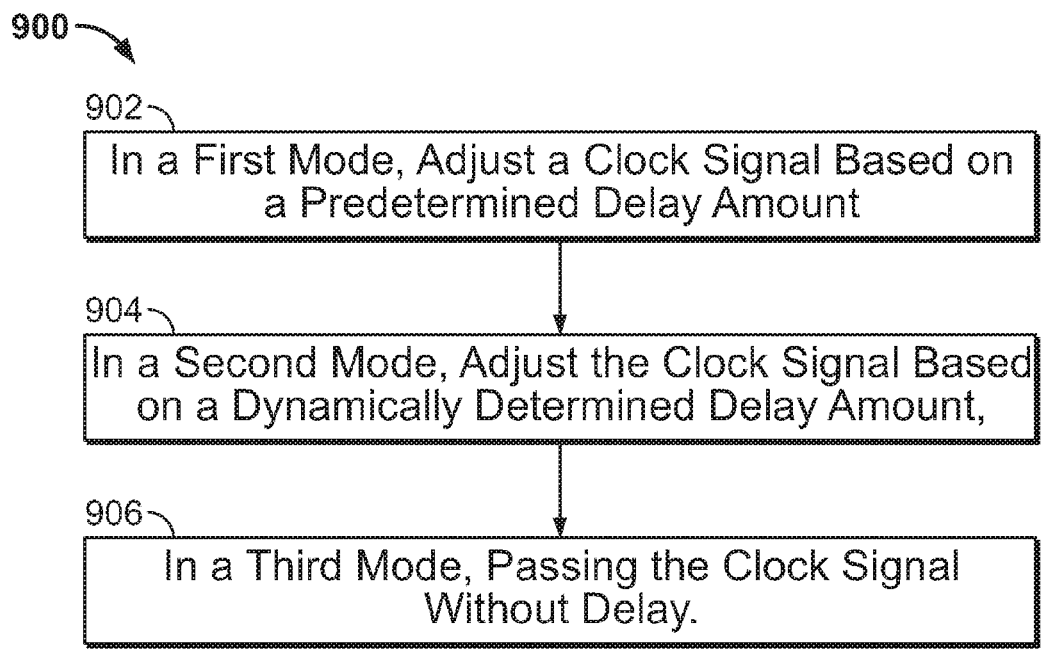
FIG. 9 is a flow diagram illustrating a process for configuring a switch box, in accordance with some embodiments.

FIG. 9 is a flow diagram illustrating a process 900 describing the operation of a switch box, in accordance with some embodiments. Process 900 may apply to any of the switch box elements and/or distributed deskew objects described above.

At 902, the switch box element is operable according to a first, dynamic-deskew mode so that the switch box element adjusts the clock signal based on a dynamically determined delay amount. In this mode, the delays may be dynamically adjusted throughout the operation of the integrated circuit, e.g., based on a clocking signal feedback signal such as signal 412 of FIG. 4B. This may be the most computationally-extensive mode of the switch box element, and may be used where high performance goals and low skew values are desired.

At 904, the switch box element is operable according to a second, static-deskew mode so that the switch box element adjusts the clock signal based on a pre-determined delay amount. For example, the static deskew quantity may be fixed at the beginning of the operation of the integrated circuit and used thereafter for deskewing.

At 906, the switch box element is operable according to a third, no-deskew mode so that the switch box element passes the clock signal without delay. For example, the control logic of the switch box element may be deactivated, e.g., so that no deskewing DLL function is applied by the distributed deskew object. This may be done where no additional deskewing functions are needed, e.g., where the integrated circuit design allows for relatively large skew margins.

In some processes 900, only two of the modes may be provided, depending, for example, on the anticipated use of the integrated circuit. In some processes 900, the order of the modes is inverted, so that process 900 begins at the no-deskew mode and increases deskew functionalities (to static- and/or dynamic-deskew) as needed. In some processes 900, a decision step (not shown) corresponds to a mode determination node, in which it is decided which of the modes (no-, static-, or dynamic-deskew) the switch box element should operate in. This determination may be done based on user input (e.g., manual configuration) and/or may be done automatically depending on acceptable skew margins of the application being used. Other modifications may be made to processes 800 and 900 without departing form the scope of this disclosure.

Figure 6:
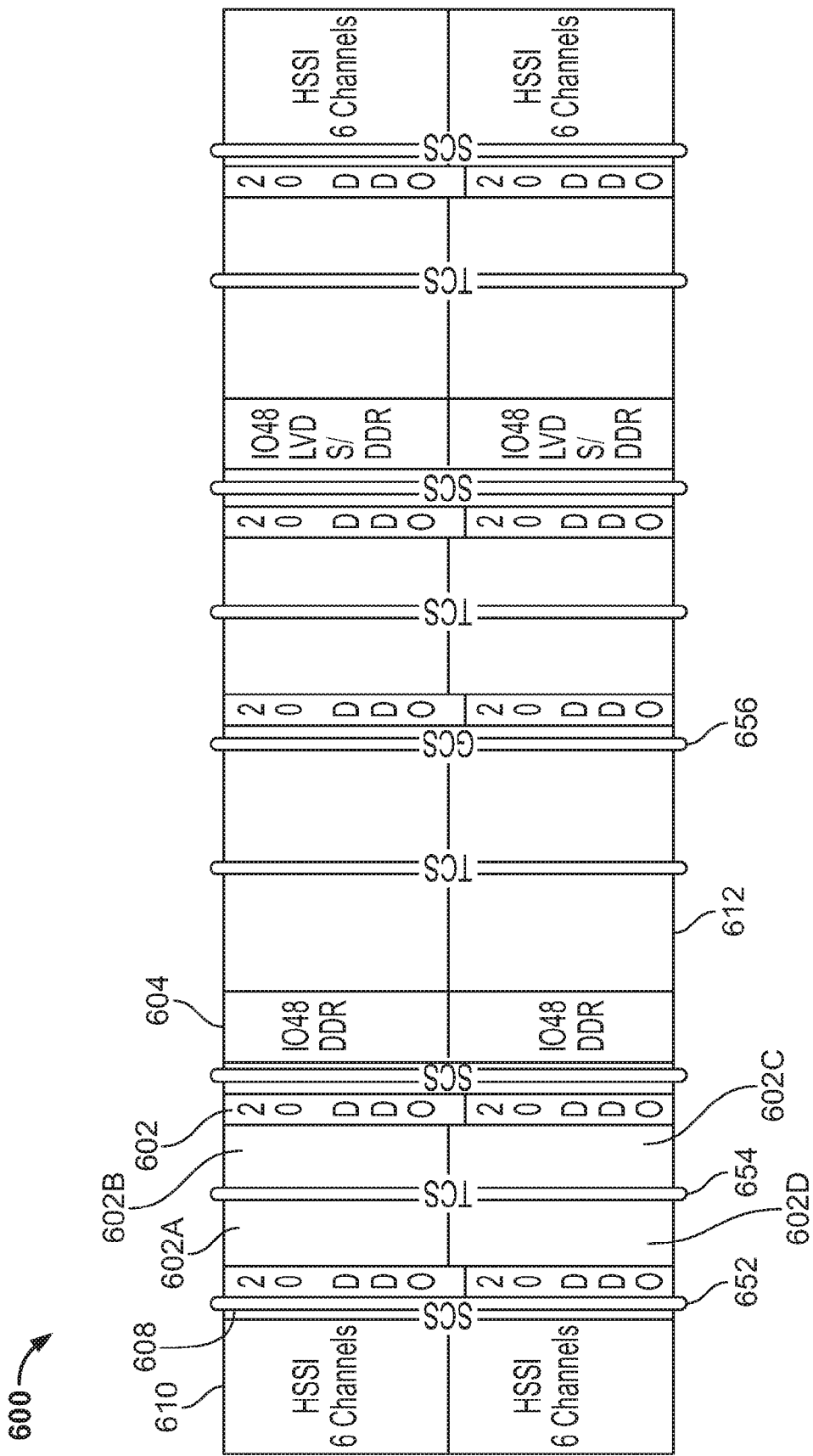
FIG. 6 shows an illustrative floorplan as one example of an architecture/device incorporating a clock grid distribution network according to some embodiments.

FIG. 6 illustrates an illustrative floorplan 600 as one example of an architecture/device incorporating a clock grid distribution network according to some embodiments. Floorplan 600 includes programmable regions 612 accessible to programmable interconnect structures such as secondary clock spine (SCS) 652, tertiary clock spine (TCS) 654, global clock spine (GCS) 656, and distributed deskew object columns 602. In the illustrated implementation, forty distributed deskew objects are located in one column 602 at the intersection of four tertiary spine regions 602A, 602B, 602C, and 602D. This may create ten global clocks that serve all four of the intersecting tertiary spine regions for a large number of logic elements. The layout of regions 612 and interconnect structures 602, 652, 654, and 656 as shown in FIG. 6 is intended to be schematic only, as many actual arrangements are known to, or may be created by, those of ordinary skill in the art.

Floorplan 600 also includes a plurality of I/O regions, such as local I/O regions 604 and global I/O regions 610. In the illustrative example of FIG. 6, I/O regions 610 correspond to HSSI I/O blocks, and I/O regions 604 correspond to memory (e.g., double data rate (DDR)) and/or Low-voltage differential signaling (LVDS) I/O blocks. This is meant for the purpose of illustration only, not limitation and various types of input and/or output blocks may be used without departing from the scope of this disclosure. For example, I/O regions 604 and 610 may be programmable, allowing the selection of one of a number of possible I/O signaling schemes, which may include differential and/or non-differential signaling schemes. Alternatively, I/O regions 604 and 610 may be fixed, each allowing only a particular signaling scheme. In some embodiments, a number of different types of fixed I/O regions 604 and 610 may be provided, so that while an individual region 604 or 610 does not allow a selection of signaling schemes, nevertheless floorplan 600 as a whole does allow such a selection.

Like the layout of logic regions 612 and interconnect structures 602, 652, 654, and 656, the layout of I/O regions 604 and 610 as shown in the drawings is schematic. Logic regions 612 may be arranged in rows of logic, and each I/O region 610 and/or 604 may or may not line up with an individual row of logic. For example, in one embodiment, there may be two I/O regions 610, and hence two peripheral clock signals, for every three rows of logic regions 612.

Any of I/O regions 604 and 610 could generate or recover a signal, such as a clock signal, that is to be distributed by a clock network in accordance with the present disclosure, or could receive such a signal from outside floorplan 600.

Figure 7:
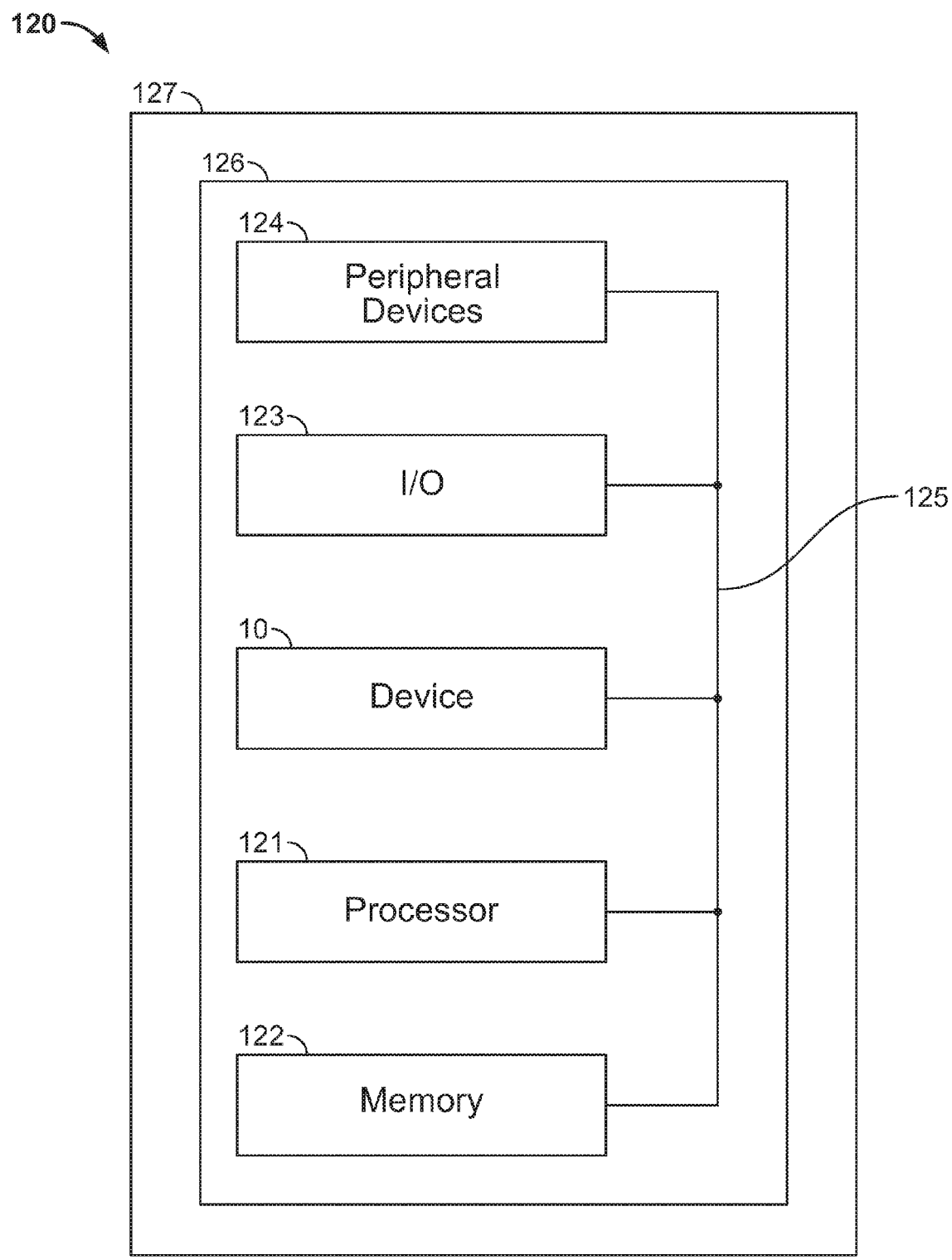
FIG. 7 is a simplified block diagram of an illustrative system incorporating a clock network in accordance with some embodiments.

A device 10 incorporating periphery clock networks as described above may be used in many kinds of electronic devices. One possible use is in a data processing system 120 shown in FIG. 7. Data processing system 120 may include one or more of the following components: a processor 121; memory 122; I/O circuitry 123; and peripheral devices 124. These components are coupled together by a system bus 125 and are populated on a circuit board 126 which is contained in an end-user system 127.

System 120 can be used in a wide variety of applications, such as computer networking, data networking, instrumentation, video processing, digital signal processing, or any other application where the advantage of using programmable or reprogrammable logic is desirable. Device 10 can be used to perform a variety of different logic functions. For example, device 10 can be configured as a processor or controller that works in cooperation with processor 121. Device 10 may also be used as an arbiter for arbitrating access to shared resources in system 120. In yet another example, device 10 can be configured as an interface between processor 121 and one of the other components in system 120. It should be noted that system 120 is only exemplary, and that the true scope and spirit of the invention should be indicated by the following claims.

Various technologies can be used to implement devices 10 as described above and incorporating this invention.

It will be understood that the foregoing is only illustrative of the principles of the invention, and that various modifications can be made by those skilled in the art without departing from the scope and spirit of the invention. One skilled in the art will appreciate that the present invention is not limited by the disclosed embodiments, which are presented for purposes of illustration and not of limitation, and the present invention is limited only by the claims that follow.

What is claimed is:

1. A signal network for distributing clock-type signals in an integrated circuit, said signal network comprising:
   a global clock bus;
   a plurality of clock regions that intersect one another, wherein the global clock bus is coupled to the plurality of clock regions; and
   a switch box located at an intersection of the plurality of clock regions, wherein the switch box comprises a distributed deskew object that:
      detects a phase of an input clock signal provided by the global clock bus and a phase of a feedback clock signal; and
      generates an adjustable delay based at least in part on the phase of the input clock signal and the phase of the feedback clock signal.

2. The signal network of claim 1, wherein the distributed deskew object increments or decrements a counter value based at least in part on the phase of the input clock signal and the phase of the feedback clock signal.

3. The signal network of claim 2, wherein the distributed deskew object generates the adjustable delay proportional to the counter value.

4. The signal network of claim 1, wherein the distributed deskew object adjusts the feedback clock signal with the adjustable delay.

5. The signal network of claim 4, wherein a phase of the feedback clock signal adjusted with the adjustable delay is substantially equal to the phase of the input clock signal.

6. A distributed deskew object of a switch box, wherein the switch box is located at an intersection of a plurality of clock regions, wherein the distributed deskew object comprises:
   phase detector circuitry that detects a phase of an input clock signal and a phase of a feedback clock signal;
   counter circuitry that has a value that is based at least in part on the phase of the input clock signal and the phase of the feedback clock signal; and
   delay circuitry that generates an adjustable delay proportional to the value of the counter circuitry.

7. The distributed deskew object of claim 6, wherein the phase detector circuitry outputs one or more increments or decrements based at least in part on the phase of the input clock signal and the phase of the feedback clock signal.

8. The distributed deskew object of claim 7, wherein the phase detector circuitry updates the value of the counter circuitry based at least in part on the one or more increments or decrements.

9. The distributed deskew object of claim 6, wherein the delay circuitry adjusts the feedback clock signal with the adjustable delay.

10. The distributed deskew object of claim 9, wherein a phase of the feedback clock signal adjusted with the adjustable delay is substantially equal to the phase of the input clock signal.

11. The distributed deskew object of claim 6, wherein the delay circuitry comprises a plurality of delay elements.

12. The distributed deskew object of claim 11, wherein the plurality of delay elements correspond to equally sized delay values.

13. The distributed deskew object of claim 11, wherein the plurality of delay elements correspond to different delay values.

14. The distributed deskew object of claim 11, wherein each delay element of the plurality of delay elements comprises a delay block coupled to an input of a multiplexer.

15. The distributed deskew object of claim 14, wherein the multiplexer selects a delay output corresponding to a respective delay element or a delay output corresponding to a respective previous delay element.

16. A method for providing a deskewed clock signal to a clock region of a plurality of clock regions, the method comprising:
   providing a reference clock signal to a switch box connecting the plurality of clock regions;
   deskewing a feedback clock signal based on adjusting the feedback clock signal by a delay amount, wherein the delay amount is based on a phase of the feedback clock signal a phase of the reference clock signal;
   sending the feedback clock signal adjusted by the delay amount to the clock region of the plurality of clock regions; and
   feeding back the feedback clock signal adjusted by the delay amount to the switch box.

17. The method of claim 16, wherein the reference clock signal is provided by a global clock bus coupled to an intersection of the plurality of clock regions.

18. The method of claim 16, wherein deskewing the feedback clock signal comprises digitally incrementing or decrementing a control value based at least in part on a difference between the phase of the reference clock signal and the phase of the feedback clock signal.

19. The method of claim 18, wherein the delay amount is proportional to the control value.

20. The method of claim 16, wherein a phase of the feedback clock signal adjusted by the delay amount is substantially equal to the phase of the reference clock signal.

* * * * *